(12) United States Patent
Atwood et al.

(10) Patent No.: US 9,588,177 B1
(45) Date of Patent: Mar. 7, 2017

(54) OPTIMIZING GENERATION OF TEST CONFIGURATIONS FOR BUILT-IN SELF-TESTING

(71) Applicant: INTERNATIONAL BUSINESS MACHINES CORPORATION, Armonk, NY (US)

(72) Inventors: Eugene R. Atwood, Housatonic, MA (US); Mary P. Kusko, Hopewell Junction, NY (US); Paul J. Logsdon, Poughkeepsie, NY (US); Franco Motika, Hopewell Junction, NY (US); Andrew A. Turner, Underhill, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/987,849

(22) Filed: Jan. 5, 2016

(51) Int. Cl.
    *G01R 31/28* (2006.01)
    *G01R 31/3177* (2006.01)
    *G01R 31/317* (2006.01)

(52) U.S. Cl.
    CPC ... *G01R 31/3177* (2013.01); *G01R 31/31707* (2013.01)

(58) Field of Classification Search
    CPC ............. G06F 11/2221; G06F 17/5022; G01R 31/318536; G01R 31/31274; H04B 17/0085; H04B 17/11; H04B 1/109
    See application file for complete search history.

(56) References Cited

U.S. PATENT DOCUMENTS

| | | | |
|---|---|---|---|
| 8,112,686 B2* | 2/2012 | Hapke | G01R 31/318558 714/726 |
| 2003/0182604 A1 | 9/2003 | Hathaway et al. | |
| 2005/0015693 A1 | 1/2005 | Anzou et al. | |
| 2005/0229057 A1 | 10/2005 | Anderson et al. | |
| 2007/0255869 A1* | 11/2007 | Walters | G06F 11/2221 710/62 |

(Continued)

OTHER PUBLICATIONS

Wang et al., "Test-Quality/Cost Optimization Using Output-Deviation-Based Reordering of Test Patterns", IEEE, vol. 27, No. 2, Feb. 2008, pp. 352-365.

(Continued)

*Primary Examiner* — David Ton
(74) *Attorney, Agent, or Firm* — Cantor Colburn LLP; Steven Meyers

(57) ABSTRACT

Technical solutions are described for optimizing a set of test configurations used for testing an electronic circuit that includes latches. An example method includes receiving a test configuration that includes settings that initiate a set of predetermined input values and corresponding expected output values. The method also includes evaluating the test configuration by executing the electronic circuit according to the test configuration and recording parametric data during the execution, where the parametric data is representative of switching activity of the latches in the electronic circuit. The evaluation includes analyzing the parametric data to identify presence of a predetermined pattern in the switching activity and selecting the test configuration based on the predetermined pattern being absent/present in the switching activity.

20 Claims, 8 Drawing Sheets

(56) References Cited

U.S. PATENT DOCUMENTS

2009/0210763 A1    8/2009  Eckelman et al.
2009/0319818 A1  12/2009  Eustis et al.
2014/0095951 A1    4/2014  Ahmed et al.
2015/0264590 A1*  9/2015  Michl ................ H04B 17/0085
                                                                   455/67.14

OTHER PUBLICATIONS

Zollin et al., "Test Planning for Low-Power Built-In Self Test", 2014.

\* cited by examiner

LBIST Patterns for a Chip ns = launch off scan

| clk Seq | ns1 | ns2 | ns3 | ns4 | ns5 | ns6 | ns7 |
|---|---|---|---|---|---|---|---|
| 1/2 | 4k | 4k | 4k | 4k | 4k | 4k | 4k |
| 1/8 | 4k | 4k | 4k | 4k | 4k | 4k | 4k |
| 7/8 | 4k | 4k | 4k | 4k | 4k | 4k | 4k |
| 1/16 | 4k | 4k | 4k | 4k | 4k | 4k | 4k |
| 15/16 | 4k | 4k | 4k | 4k | 4k | 4k | 4k |
| 1/32 | 4k | 4k | 4k | 4k | 4k | 4k | 4k |
| 31/32 | 4k | 4k | 4k | 4k | 4k | 4k | 4k |
| 1/64 | 4k | 4k | 4k | 4k | 4k | 4k | 4k |
| 63/64 | 4k | 4k | 4k | 4k | 4k | 4k | 4k |

Weights nc = launch off clock

| Clk Seq | nc1 | nc2 | nc3 | nc4 | nc5 | nc6 | nc7 |
|---|---|---|---|---|---|---|---|
| 1/2 | 16k | 64k | 64k | 4k | 4k | 4k | 4k |
| 1/8 | 4k | 16k | 4k | 4k | 16k | 4k | |
| 7/8 | 4k | 16k | 4k | 4k | 16k | 4k | |
| 1/16 | 4k | 16k | 4k | 4k | 16k | 4k | |
| 15/16 | 4k | 16k | 4k | 4k | 16k | 4k | |
| 1/32 | 4k | 4k | 4k | 4k | 4k | | |
| 31/32 | 4k | 4k | 4k | | 4k | | |
| 1/64 | 4k | 4k | 4k | | 4k | | |
| 63/64 | 4k | 4k | 4k | | 4k | | |

Weights

Fig. 1

LBIST Run Times

| | # runs in parallel | Cvg | Hours | Max Memory |
|---|---|---|---|---|
| Scan | | 10 | | |
| Lbist 64 cycles, 9 clk sequences | 9 | 80 | 68 | 221 GB |
| Lbist 4k cycles, 9 clk sequences | 9 | 90 | 160 | 70 GB |
| Lbist 4k cycles, 9 clk seq, 8 weights | 72 | 95 | 68 | 70 GB |
| Lbist 16k of most effective clk seq and weights | 17 | 99 | 278 | 70 GB |
| Total Lbist fault simulation time: ~24 days | | | | |
| Total cumulative time: 11674 hours (486 days) | | | | |

Fig. 2

OPTIMIZING GENERATION OF TEST CONFIGURATIONS FOR BUILT-IN SELF-TESTING

BACKGROUND

The present application relates to electronic circuits, and more specifically, to testing electronic circuits.

Typically, an electronic circuit is tested using logic built in self-test (LBIST). In LBIST, a device under test (DUT), such as the electronic circuit, initializes in a testing mode and uses a test clock, which may be controlled via a tester device or is programmed into on product control logic (OPCL) within the DUT. Thus, LBIST facilitates testing an electronic circuit, such as chip, with only a reference clock.

SUMMARY

According to an embodiment, a computer implemented method for optimizing a set of test configurations used for testing an electronic circuit includes receiving a test configuration for testing the electronic circuit, where the test configuration includes settings that initiate a set of predetermined input values for the electronic circuit and further includes corresponding expected output values, where the electronic circuit includes a set of latches. The method also includes evaluating the test configuration for selection in the set of test configurations for self-testing the electronic circuit. The evaluation includes executing the electronic circuit according to the test configuration and recording parametric data from the electronic circuit during the execution, where the parametric data is representative of switching activity of the latches in the electronic circuit. The evaluation also includes analyzing the parametric data to identify presence of a predetermined pattern in the switching activity. The method also includes adding the test configuration to the set of test configurations used for self-testing the electronic circuit in response to the predetermined pattern being absent in the switching activity and rejecting the test configuration in response to the predetermined pattern being present in the switching activity.

According to another embodiment, a system for optimizing a set of test configurations for testing an electronic circuit includes a memory and a processor. The processor receives a test configuration for testing the electronic circuit, where the test configuration includes settings that initiate a set of predetermined input values for the electronic circuit and further includes corresponding expected output values, where the electronic circuit includes a set of latches. The processor also evaluates the test configuration for selection in the set of test configurations for self-testing the electronic circuit. The evaluation includes execution of the electronic circuit according to the test configuration and record parametric data from the electronic circuit during the execution, where the parametric data is representative of switching activity of the latches in the electronic circuit. The evaluation also includes analysis of the parametric data to identify presence of a predetermined pattern in the switching activity. The processor also adds the test configuration to the set of test configurations used for self-testing the electronic circuit in response to the predetermined pattern being absent in the switching activity and rejects the test configuration in response to the predetermined pattern being present in the switching activity.

According to another embodiment, a computer program product for optimizing a set of test configurations for testing an electronic circuit includes a computer readable storage medium. The computer readable storage medium includes computer executable instructions. The computer readable storage medium includes instructions to receive a test configuration for testing the electronic circuit, where the test configuration includes settings that initiate a set of predetermined input values for the electronic circuit and further includes corresponding expected output values, where the electronic circuit includes a set of latches. The computer readable storage medium includes instructions to evaluate the test configuration for selection in the set of test configurations for self-testing the electronic circuit, the evaluation includes execution of the electronic circuit according to the test configuration and record parametric data from the electronic circuit during the execution, where the parametric data is representative of switching activity of the latches in the electronic circuit. The evaluation also includes analysis of the parametric data to identify presence of a predetermined pattern in the switching activity. The computer readable storage medium includes instructions to add the test configuration to the set of test configurations used for self-testing the electronic circuit in response to the predetermined pattern being absent in the switching activity and rejecting the test configuration in response to the predetermined pattern being present in the switching activity.

BRIEF DESCRIPTION OF THE DRAWINGS

The examples described throughout the present document may be better understood with reference to the following drawings and description. The components in the figures are not necessarily to scale. Moreover, in the figures, like-referenced numerals designate corresponding parts throughout the different views.

FIG. 1 illustrates a typical set of LBIST patterns in accordance with an embodiment.

FIG. 2 illustrates run times and memory requirements for executing tests for the chip based on the LBIST patterns in accordance with an embodiment.

DETAILED DESCRIPTION

Figure 3:
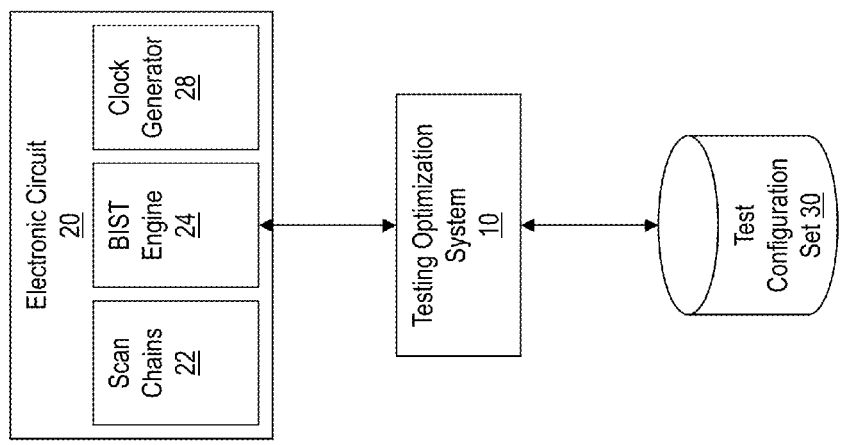
FIG. 3 illustrates an example testing scenario in accordance with an embodiment.

Typically, a tester device tests an electronic circuit. The electronic circuit may be a chip in devices like phones, computers, televisions, display devices, and others. For example, the tester device stores predetermined test patterns, for example, a value per latch (in the electronic circuit). During execution of the test, the tester device applies the stored test pattern to the electronic circuit to verify the actual measured response matches the expected response. For example, the tester device also stored a clock or capture sequence. The tester device records measured values per latch during execution of the test pattern and compares the measured values with the predetermined output values, upon pattern execution. However, for the tester device, which may be external to the electronic circuit, to apply and measure such values, the electronic circuit has to be configured in a way that the tester device had access to each latch.

To overcome such a design, built-in circuit test methods are used, which reduce the amount of data that the tester device stores. In addition, built-in self-tests, or self-tests, also support alternate logic tests, scan configurations, or other test types, which reduce not only the tester memory to store the test data, but also the tester time to scan in the stimulus and scan out the measure values. For example, a built-in test method is Logic Built-in self-test (LBIST), in which the electronic circuit is configured in a Self-Test Using MISR and PRPGs (STUMPS) configuration where all the scannable latches are broken into short chains fed by a pseudo random pattern generator (PRPG). A PRPG is initialized with a seed and provides the stimulus to the STUMPS chains. A clocking sequence is applied, which exercises the logic under test. The measure values are compressed into a Multiple Input Signature Register (MISR). Thus, for the self-tests, only the seed, clock sequence, repeat count and MISR measure are stored in the tester device. For example, tests that use 'through the pins' (TTP) the values may be stored in the tester device but for tests that use OPCG the values may be loaded into the device under test (DUT) and executed from that location. In another example, TTP tests rely on tester device to control the operation of the testing, while in case of OPCG tests, the tests can execute with only a reference clk provided. Since the latch stimulus is generated on chip, a STUMPS scan configuration is used, reducing time for applying the stimulus and unloading the response values. In an example, loading the stimulus may be overlapped with unloading the values from the MISR, further reducing the testing time. Typically, sections of the logic under test may be "resistant" to randomly generated test values which are typically 50% ones and 50% zeros, that is the sections are unable to propagate internal states to an observable latch(es). Accordingly, a weighted LBIST is used to target such random resistant parts of the design that require a heavier frequency of 1's or 0's for adequate testing, or to activate logic branches that are not activated without a specific frequency of input values. For weighted LBIST, the STUMPS chains are weighted, For example, instead of there being a 50% chance of 1 or 0, there's an increased probability of one of the other. For example, with a one's referenced $1/16$ weight, roughly every $15/16$ latch values will be 0. Empirically weighted LBIST testing has been effective, and different LBIST variations are used in designing a test, for example employing different weights. For example, a manufacturing test may include LBIST patterns with weights, $1/2$, $1/8$, $7/8$, $1/16$, $15/16$, $1/32$, $31/32$, $1/61$ and $63/64$, or any other.

When applying LBIST patterns for testing the electronic circuit, the tester device not only varies the weights, but also the clock sequence. For example, the clock sequences may be DC (slow) or at-speed. When targeting delay defects, at speed patterns clock sequences are of particular importance. Typical clock sequences are launch off scan or launch off clock. Each exercises the electronic circuit, which is the device under test (DUT), in a different manner. Along with varying the launch clock, the number of clocks may also be varied, which may facilitate testing of paths untestable with sequences with less clocks.

Thus, between weights and clock sequences there are a large number of LBIST patterns that can be generated and applied to test the electronic circuit. FIG. 1 illustrates a typical set of LBIST patterns, which may be generated for a chip using different clock cycles. In the example illustrated in FIG. 1, the number of clock cycles are represented across the top (ns1=1 clock cycle, ns2=clock cycles, and so on). For example, the LBIST variations are generated and applied during manufacturing of the electronic circuitry. The selection of the LBIST pattern and execution parameters may be based on fault simulation and heuristic pattern selection methods. The number of LBIST patterns generated and applied is to ensure that at least a predetermined testing coverage is achieved. FIG. 2 illustrates run times and memory requirements for executing tests for the chip using the LBIST patterns, such as those in FIG. 1. As can be seen, the individual test times may run into days, the amount of memory used is in Gigabytes (GB) and cumulative run times greater than a year. In other words, the test data volumes can be high due to the available variations, and test selection is required to choose effective pattern sequences from large test sets. Thus, it is typically not practical to have a test coverage number for each variation due to time and resource constraints. The constraints may include DC fault mark off and the like to reduce number of simulation cycles.

The technical solutions described herein provide alternatives and/or improvements to a typical software/model simulation to generate a set of LBIST patterns to test an electronic circuit, by overcoming search space limitation for coverage characteristics of LBIST patterns. Typical methods use a software model to simulate LBIST pattern(s) to learn fault coverage of the pattern. While effective, the breadth of the space to be searched (through simulation) is so large that, even with optimized computing resources, the time and effort to select an optimal set of BIST patterns for an electronic circuit is significant. As designs of electronic circuits become larger computer simulation time and effort becomes even more pronounced. Accordingly, the technical solutions described herein use stimulus and response from hardware as the basis for analysis and selection of test configurations for the electronic circuit. In an example, the technical solutions facilitate generation of an optimized set of LBIST patterns by analyzing switching activity of a reference electronic device while varying multiple LBIST execution parameters over a broad operating space. The switching activity represents the changes in the latches or other components of the electronic circuit during operation of the electronic circuit. For example, the switching activity may include variations in electrical current, voltage, or other parameters of the latches or multi-input signature registers of the electronic circuit. The switching activity may further include thermal variations of the components of the electrical circuit. Although embodiments described here use LBIST pattern generation as examples, it will be obvious to a person skilled in the art that the technical solutions described are applicable to optimize other test patterns beyond LBIST, such as pattern logic testing, memory testing, functional testing, complex digital sensors, and the like.

FIG. 3 illustrates an example testing scenario in which a testing optimization system 10 selects a set of test configurations 30 to test an electronic circuit 20. The electronic circuit 20 includes scan chains 22, a BIST engine 24, and a clock generator 28, among other components. The electronic circuit is composed of an interconnected network of combinational logic and memory elements, such as latches.

The electronic circuit 20 may be a chip, an integrated circuit, or a combination thereof, such as a device that includes multiple electronic circuits. The scan chains 22 may include a latch, flip-flop, or a bistable multivibrator. A latch has two stable states and can be used to store state information. The latches in the scan chains 22 can be made to change state by signals applied to one or more control inputs and will have one or two outputs. The output of the scan chains 22 may be controlled by OPCL programming, such as by a processor that is part of the electronic circuit 20. In other examples, the output of the scan chains 22 is based on propagation of the input signals according to a clock signal, which may be generated by the clock generator 28.

Figure 4:
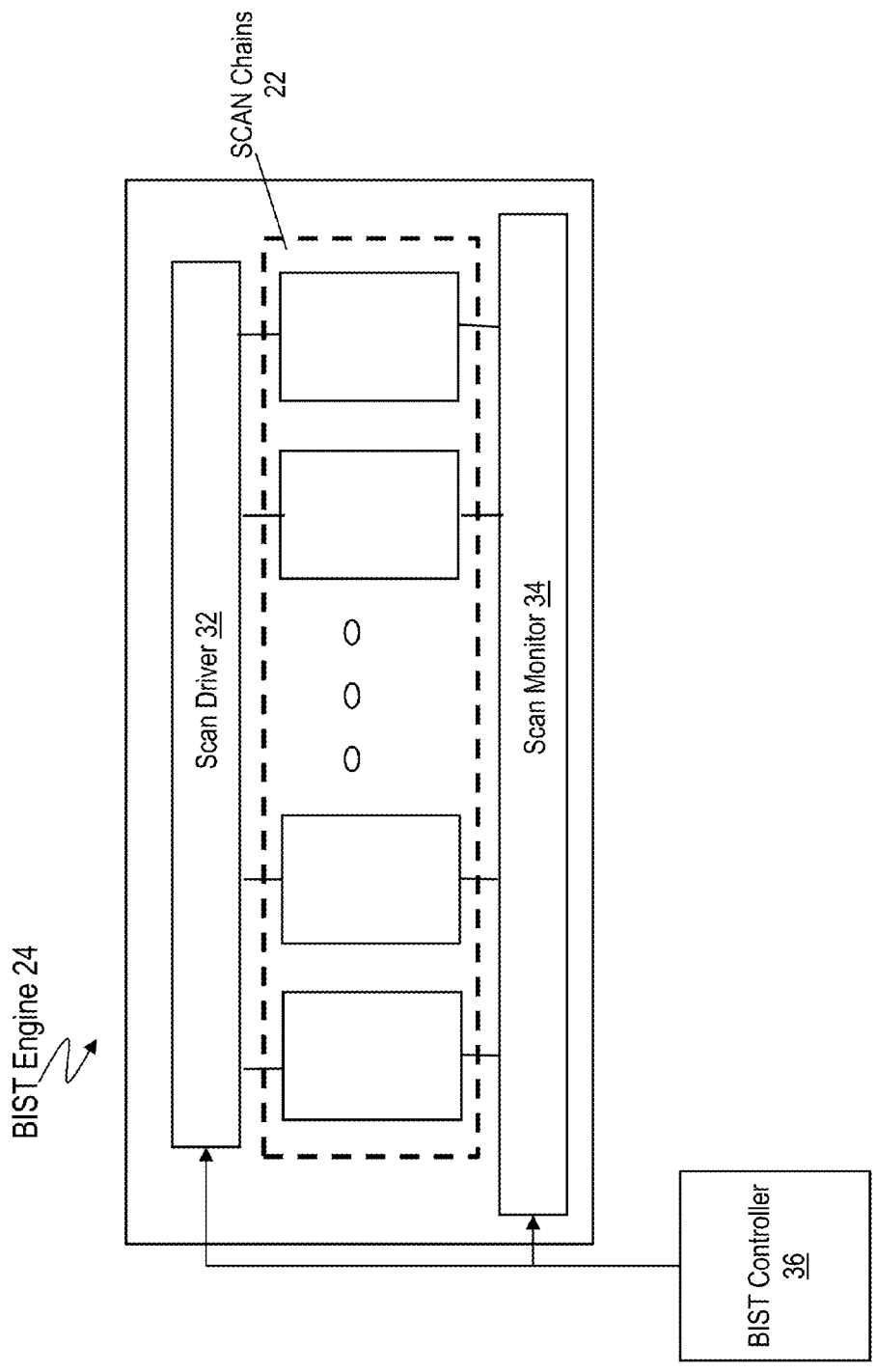
FIG. 4 illustrates example components of a built-in self-testing engine in accordance with an embodiment.

The BIST engine 24 is on-chip circuitry included to generate test patterns, evaluate test responses, and control the test. The BIST engine 24 may communicate with the testing optimization system 10 to facilitate selection of the optimal set of test configurations for the electronic circuit 20. FIG. 4 illustrates example components of the BIST engine 24. For example, the BIST engine includes, among other components, a BIST controller 36 a scan driver 32 containing a device for generating test pattern data, a scan monitor 34, a shift counter (not shown), and a pattern counter (not shown). Components of the BIST engine 24 may further include components, such as a phase shifter in the scan driver and/or a space compactor in the scan monitor.

For example, the scan driver 32 generates the test patterns, dynamically in response to the electronic circuit 20 being switched into a 'test-mode' or a 'self-test mode'. For example, the scan driver 32 uses hardware such as pseudo-random pattern generator (PRPG) to generate the test pattern. The PRPG may be implemented as a hardware structure such as a linear feedback shift register (LFSR). An LFSR comprises a sequence of chained data memory elements forming a shift register. A given LFSR of length n is represented by its characteristic polynomial $h_n x^n + \ldots + h_1 x + h_0$, where the term $h_i x^i$ refers to the ith flip-flop of the register, such that, if $h_i=1$, then there is a feedback tap taken from this flip-flop. When the proper tap connections are established in accordance with the given polynomial, the combined (added modulo 2) output of each stage is feedback to the first stage of the LFSR. Such an implementation is called type I LFSR or Fibonacci generator. An alternative implementation uses a shift register with XOR gates placed between the LFSR cells. It is called type II LFSR or Galois true divisor. The output of the last stage of the type II LFSR is fed back to those stages, which are indicated by the characteristic polynomial employed. A polynomial which causes an n-bit LFSR to go through all possible $2^n-1$ nonzero states is called a primitive characteristic polynomial. A corresponding LFSR is often referred to as a maximum-length LFSR, while the resultant output sequence is termed a maximum-length sequence or m-sequence.

The pattern counter controls sequences of test patterns generated by PRPG and applied though the scan chains 22 of the electronic circuit 20. To reduce correlation between the scan chains 22, a phase shifter is inserted between the PRPG and the scan chains 22. The phase shifter may include a network of exclusive-or (XOR) devices employed to avoid shifted versions of the same data in various scan paths.

The BIST controller 36 operates to sequentially load, or shift, the test pattern data generated by the scan driver 32 into the scan chains 22. The shift counter indicates how many shift cycles must be performed before all scan chains 22 in the electronic circuit 20 have been filled. As each test data bit is shifted in, the response to a test data bit shifted in during the previous pattern is shifted out of scan chains 22 and into the scan monitor 34, which may contain a multiple input shift register (MISR), or a similar signature generation element. The scan monitor 34 compresses the response data into a signature which is analyzed for errors. In an example, the number of inputs to the scan monitor 34 cannot exceed the number of bits in the MISR. A space compactor (not shown) may be used if there are more scan chains 22 than there are bits in the MISR. For example, the space compactor combines adjoining scan chains using XOR gate structures until the number of space compactor outputs is equal to the number of bits, or stages, in the MISR.

In an example, once a load/unload operation has been completed, the electronic circuit 20 enters a non-scan mode. The BIST engine 24 captures response data, that is measured values from the MISR in the scan monitor 34. In an example, during capture operations, output from the scan chains 22 is not shifted into the scan monitor 34, and test patterns are not input to the scan chains 22 by the scan driver 32. For example, the MISR and the PRPG may be placed in a non-functional state during capture operations to avoid timing problems. After capture, the electronic circuit 20 is ready for the next load/unload operation. In another example, while the responses from the scan chains 22 are unloaded into the MISR, new values are loaded into the scan chains 22 from the PRPG. The BIST controller 36 may compare the measured values in the MISR with the predetermined (or expected) output to determine if the electronic circuit 20 passed or failed the test.

The BIST engine 24 may further be responsible to initialize the electronic circuit 20 in the test mode according to execution parameters. For example, the BIST engine 24 may send an initial seed value to the PRPG to generate the test pattern to load into the scan chains 22. The initial seed value may control the test pattern that is generated in a pseudo-random manner by the PRPG. Further, the BIST engine 24 sets up other execution parameters such as the clock sequence to be used when applying the test pattern that the PRPG generates. For example, the BIST engine 24 sets up parameters of the clock generator 28, which may include launch off scan/launch off clock, a number of clocks, which timing hold (tholds) are dropped, a clock gate used for controlling which parts of the electronic circuit are active, a scan latch (sl), a non-scan latch (nsl), array, array write through (LBIST combined), wait cycles between scan and clock start, and the like. The BIST engine 24 may further control the timing between the clocks. The BIST engine 24 may determine the setup of the clock sequence based on whether the test is being performed through the pins or using OPCL programming. Additional execution parameters that may be varied include a clock sequence, which can be a launch off scan or launch off clock (capture). A clock sequence can have 1 clock pulse or any number of clock pulses. In addition or alternatively, the number of Lbist loops may be varied. In addition or alternatively, the delay between the scan and beginning of the clock sequence and the delay between the end of the clock sequence and the scan unload may also be varied. The electronic circuit 20 may include scannable and non-scan latches. Accordingly, which of the types of latches of the electronic circuit 20 are clocked may also be varied. The electronic circuit 20 may further include different scan types, such as functional latches, abist latches, and the like. The type of latches to be included in monitoring the switching activity may be varied by the execution parameters. Thus, the execution parameters may vary the sections/regions of the electronic circuit 20 that are monitored for switching activity.

The BIST engine 24 may initialize the electronic circuit 20 in the test-mode based on test configurations in the set of test configurations 30. For example, the set of test configurations 30 may be a repository of test configurations. Although, in the example illustrated FIG. 3, the set of test configurations 30 is illustrated separate from the electronic circuit 20, the set of test configurations 30 may be part of the electronic circuit 20 in another example. In an example, the set of test configurations 30 includes an optimized collection of test configurations. For example, the optimized collection of test configurations facilitates testing the electronic circuit 20 using predetermined amount of resources, within a predetermined threshold duration, and provides at least a predetermined testing coverage. In an example, the predetermined coverage is based on a Stuck-at Fault model, or any other testing coverage threshold determination technique. A test configuration from the set of test configurations 30 may specify the execution parameters for initializing the electronic circuit 20 for a test, such as clock sequence, scan chain weights, scan variables, clock gating, active logic, and the like. For example, the scan variables may include control of timing between scan and clock sequence, and/or control of timing between end of clock sequence and scan. The test configuration may further specify the stimulus to the scan chains 22, for example, an input test pattern, or an initial seed value to generate the test pattern via the PRPG, and the like. The test configuration may further include the expected output of the test given the stimulus. The test configurations in the set of test configurations 30 may be generated and stored by the testing optimization system 10.

Figure 5:
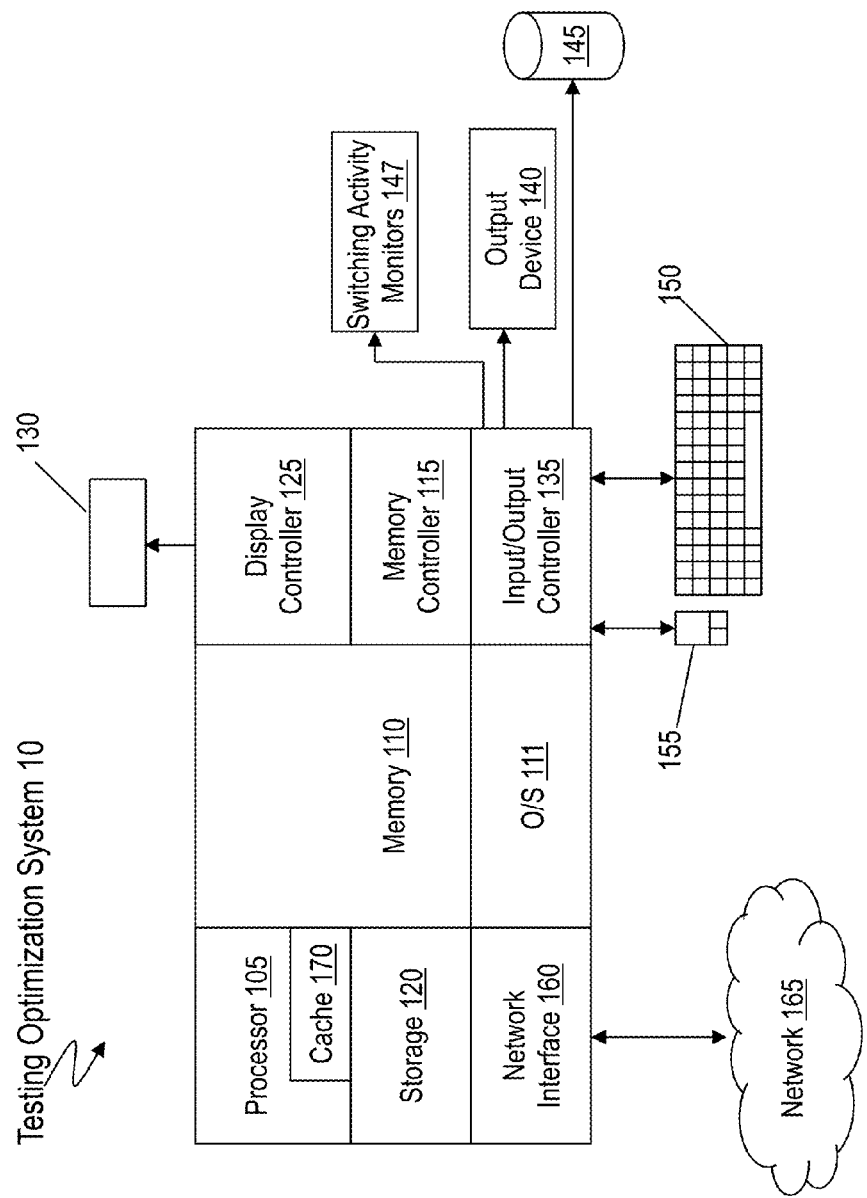
FIG. 5 illustrates example components of a testing optimization system in accordance with an embodiment.

FIG. 5 illustrates example components of the testing optimization system 10. The testing optimization system 10 may be an automated test equipment, such as a computer. For example, the system 10 may be a desktop computer, a tablet computer, a laptop computer, a phone, such as a smartphone, a server computer, or any other device that monitors switching activity of the electronic circuit 20. The system 10 includes hardware, such as electronic circuitry.

The system 10 includes, among other components, a processor 105, memory 110 coupled to a memory controller 115, and one or more input devices 145 and/or output devices 140, such as peripheral or control devices, that are communicatively coupled via a local I/O controller 135. These devices 140 and 145 may include, for example, battery sensors, position sensors, indicator/identification lights, and the like. The system 10 further includes switching activity monitors 147, which include devices to monitor switching activity of the latches of the electronic circuit 20. For example, the switching activity monitors 147 include connectors for interfacing with components of the electronic circuit 20, such as the scan chains 22, the BIST engine 24, and the like. The switching activity monitors 147, for example, monitor current used by the components of the electronic circuit 20, temperature of the components in the electronic circuit 20, during execution of the tests. The Input devices such as a conventional keyboard 150 and mouse 155 may be coupled to the I/O controller 135. The I/O controller 135 may be, for example, one or more buses or other wired or wireless connections, as are known in the art. The I/O controller 135 may have additional elements, which are omitted for simplicity, such as controllers, buffers (caches), drivers, repeaters, and receivers, to enable communications.

The I/O devices 140, 145 may further include devices that communicate both inputs and outputs, for instance disk and tape storage, a network interface card (NIC) or modulator/demodulator (for accessing other files, devices, systems, or a network), a radio frequency (RF) or other transceiver, a telephonic interface, a bridge, a router, and the like.

The processor 105 is a hardware device for executing hardware instructions or software, particularly those stored in memory 110. The processor 105 may be a custom made or commercially available processor, a central processing unit (CPU), an auxiliary processor among several processors associated with the system 10, a semiconductor based microprocessor (in the form of a microchip or chip set), a macroprocessor, or other device for executing instructions. The processor 105 includes a cache 170, which may include, but is not limited to, an instruction cache to speed up executable instruction fetch, a data cache to speed up data fetch and store, and a translation lookaside buffer (TLB) used to speed up virtual-to-physical address translation for both executable instructions and data. The cache 170 may be organized as a hierarchy of more cache levels (L1, L2, and so on.).

The memory 110 may include one or combinations of volatile memory elements (for example, random access memory, RAM, such as DRAM, SRAM, SDRAM) and nonvolatile memory elements (for example, ROM, erasable programmable read only memory (EPROM), electronically erasable programmable read only memory (EEPROM), programmable read only memory (PROM), tape, compact disc read only memory (CD-ROM), disk, diskette, cartridge, cassette or the like). Moreover, the memory 110 may incorporate electronic, magnetic, optical, or other types of storage media. Note that the memory 110 may have a distributed architecture, where various components are situated remote from one another but may be accessed by the processor 105.

The instructions in memory 110 may include one or more separate programs, each of which comprises an ordered listing of executable instructions for implementing logical functions. In the example of FIG. 2, the instructions in the memory 110 include a suitable operating system (OS) 111. The operating system 111 essentially may control the execution of other computer programs and provides scheduling, input-output control, file and data management, memory management, and communication control and related services.

Additional data, including, for example, instructions for the processor 105 or other retrievable information, may be stored in storage 120, which may be a storage device such as a hard disk drive or solid state drive. The stored instructions in memory 110 or in storage 120 may include those enabling the processor to execute one or more aspects of the systems and methods of this disclosure.

The system 10 may further include a display controller 125 coupled to a user interface or display 130. In some embodiments, the display 130 may be an LCD screen. In other embodiments, the display 130 may include a plurality of LED status lights. In some embodiments, the system 10 may further include a network interface 160 for coupling to a network 165. The network 165 may be an IP-based network for communication between the system 10 and an external server, client and the like via a broadband connection. In an embodiment, the network 165 may be a satellite network. The network 165 transmits and receives data between the system 10 and external systems. In some embodiments, the network 165 may be a managed IP network administered by a service provider. The network 165 may be implemented in a wireless fashion, for example, using wireless protocols and technologies, such as WiFi, WiMax, satellite, or any other. The network 165 may also be a packet-switched network such as a local area network, wide area network, metropolitan area network, the Internet, or other similar type of network environment. The network 165 may be a fixed wireless network, a wireless local area network (LAN), a wireless wide area network (WAN) a personal area network (PAN), a virtual private network (VPN), intranet or other suitable network system and may include equipment for receiving and transmitting signals.

Figure 6:
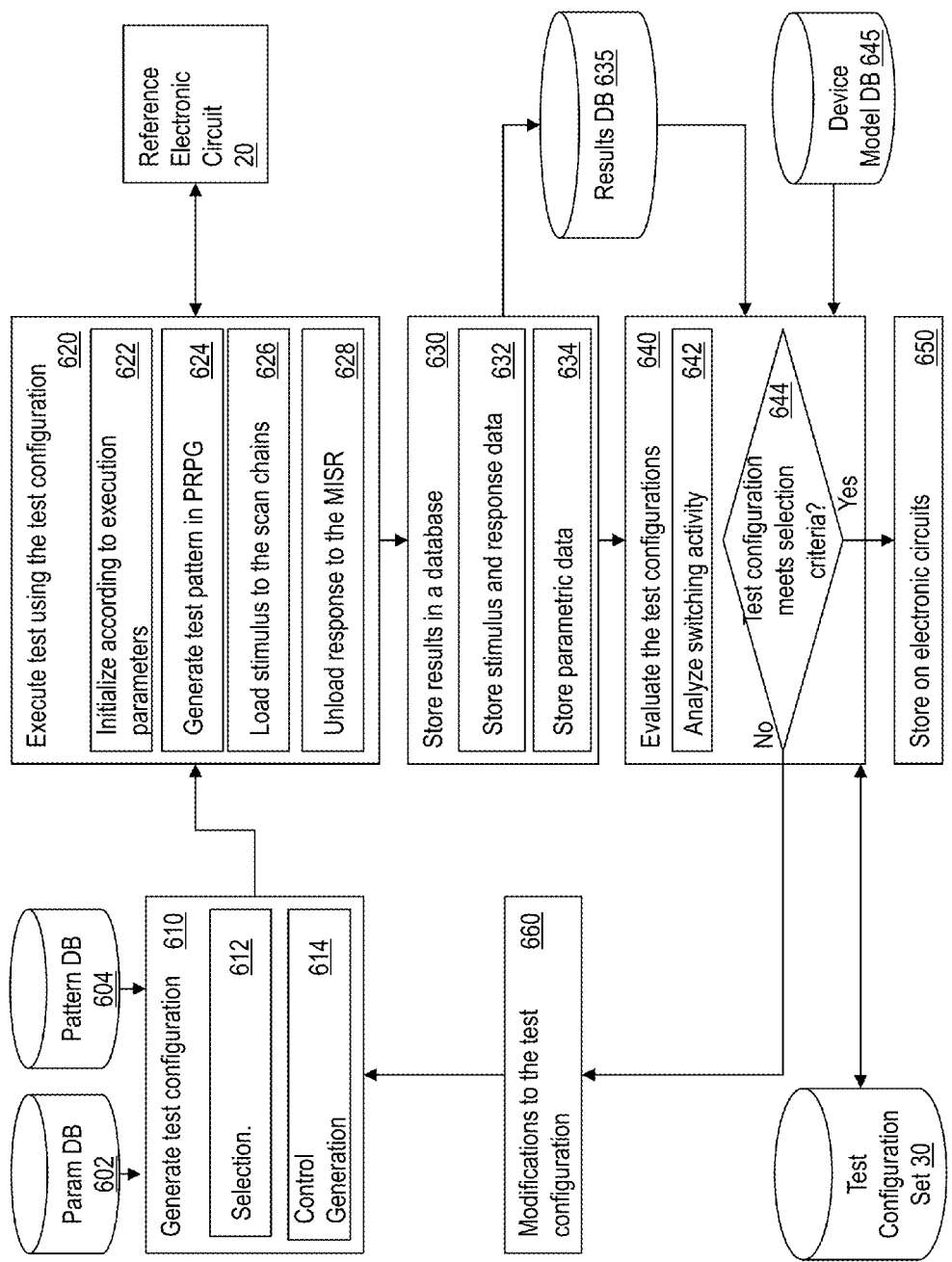
FIG. 6 illustrates a flowchart of example logic for optimizing a set of test configurations used for testing an electronic circuit in accordance with an embodiment.

FIG. 6 illustrates a flowchart of example logic for optimizing a set of test configurations used for testing the electronic circuit 20. For example, the testing optimization system 10 analyzes the switching activity of the electronic circuit 20 the necessary metric(s) to select the right parameters to vary for the optimal set of LBIST patterns.

In an example, the testing optimization system 10 generates a test configuration for the electronic circuit 20, as shown at block 610. In another example, a test generation system, which is separate from the testing optimization system 10, generates the test configuration. The test configuration may be generated using a set of parameters from a parameters database 602 and a set of LBIST execution templates 604. For example, the selection process selects parameters, which are fed into an LBIST control program, as shown at blocks 612 and 614. In an example, the control program runs on a device supporting LBIST, such as the device that is or includes the electronic circuit 20, for example an IBM zSeries CP™ device. The test configuration generation may further take into account previous iterations of the optimization, as described further.

The test configuration is used to execute a test on the electronic circuit 20, which is a reference electronic circuit, as shown at block 620. In an example, the test is executed on a reference electronic circuit, and not in a simulated environment. The testing optimization system 10 may be invoked to instruct the BIST engine 24 to execute the test. For example, the test optimizing system 10 supplies a digital signaling interface for communication with the electronic circuit 20, reference clocks, power supplies, thermal control and various analog measurement resources. The execution includes initializing the electronic circuit 20 according to execution parameters, as shown at block 622. The scan driver 32 generates the test pattern for the test, for example based on the initial seed value from the execution parameters, as shown at block 624. The BIST engine 24 loads the test pattern into the scan chains 22, and unloads the response data from the scan monitor 34, as shown at blocks 626 and 628.

The BIST engine 24 stores the results of the test execution (also referred to a LBIST run) into a results database 635, as shown at block 630. The BIST engine 24 stores the stimulus and response data from the test execution, as shown at block 632. The BIST engine 24 also monitors and stores parametric data during the execution of the test, as shown at block 634. The parametric data during the test includes temperature of the electronic circuit 20, temperature of the MISR, electrical current values used by the electronic circuit 20, and electrical current values used by the MISR during the test execution. Further, latch readouts (also referred to as ring dumps) facilitate identifying faults in the electronic circuit such as stuck at one/stuck at zero faults, and/or perform adjacency analysis as described herein.

The testing optimization system 10 evaluates the test configurations, based on the data in the results database 635 and a physical model of the device 645, as shown at block 640. The testing optimization system 10 analyzes the parametric data stored in the results database 635 to determine if the test configuration meets selection criteria, as shown at blocks 642 and 644. The selection criteria may include the parametric data including (or not including) a predetermined pattern, or the parametric data meeting a predetermined threshold, or the like or a combination thereof. If the selection criteria are not met, the testing optimization system 10 rejects the test configuration. In an example, the testing optimization system 10 returns a modification to the test configuration, as shown at block 660. The modification information is fed back to the control generation. Otherwise, if the selection criteria are met, the test configuration is selected as an optimized test configuration and stored in instances (or replicas) of the electronic circuit, such as during manufacturing and/or testing, as shown at block 650. In an example, the test LBIST pattern of the test configuration may be further optimized, such as using a pattern optimization algorithm prior to storing the test configuration. In an example, the selected test configuration is added/stored in the set of test configuration 30, from which the test configurations may be stored into the electronic circuits during manufacturing for self-testing.

Figure 7:
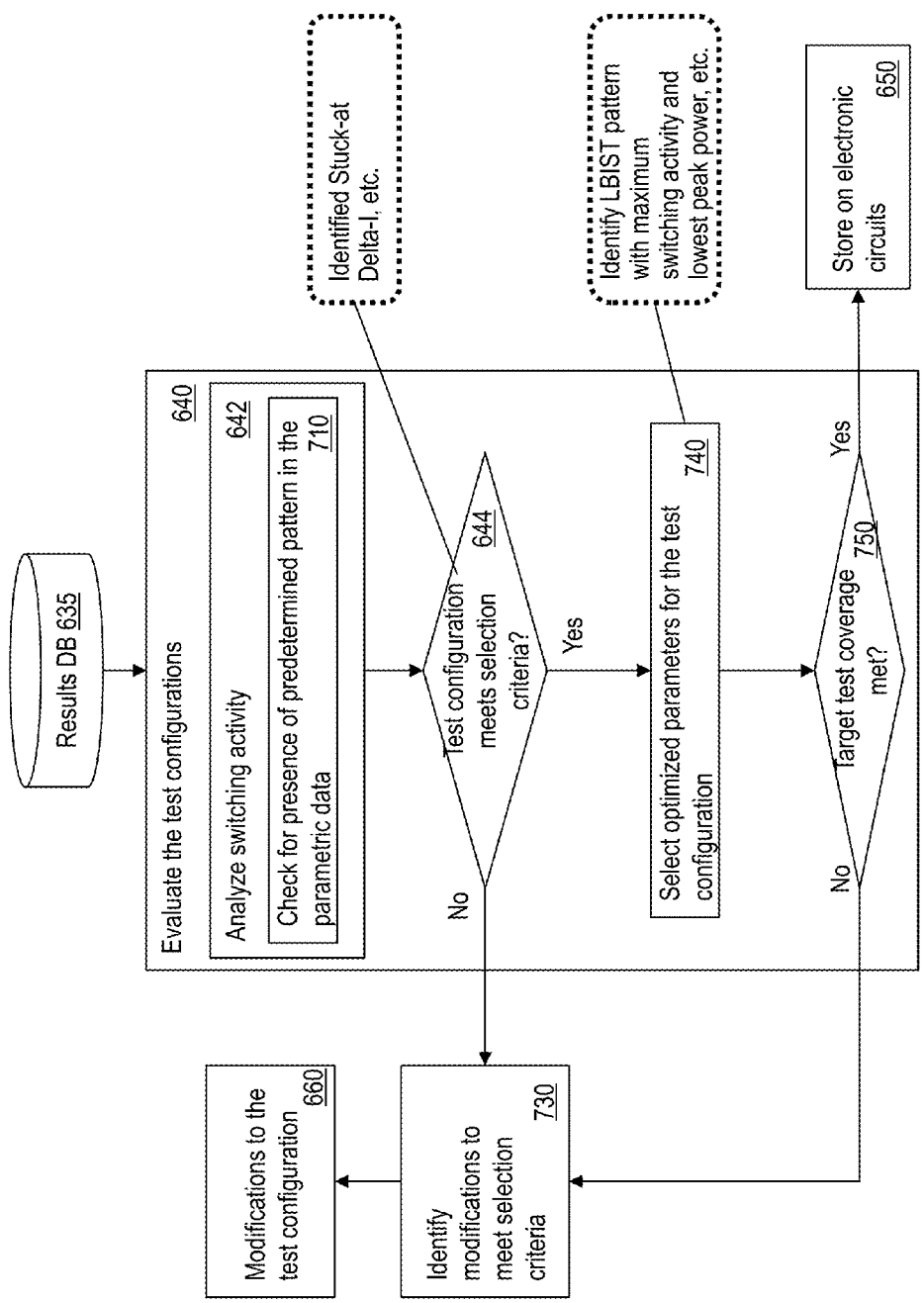
FIG. 7 illustrates a flowchart for analyzing the switching activity in accordance with an embodiment.

FIG. 7 illustrates a flowchart for analyzing the switching activity according to an example. In an example, the testing optimization system 10 analyzes each test configuration as it is generated. In another example, the testing optimization system 10 analyzes multiple test configurations from the results database 635. One example analysis is based on the parametric data monitored and recorded during the test execution. For example, the testing optimization system 10 checks for presence of a predetermined pattern in the parametric data, as shown at block 710. For example, the testing optimization system 10 analyzes electrical current values used by the electronic circuit 20, or by the MISR of the electronic circuit 20, during the test execution. The testing optimization system 10 determines if the electrical current values during the test execution has regions of low or no switching or a large delta-I. In an example, a test configuration that includes an LBIST pattern that results in the electrical current values with such a predetermined pattern is rejected. In another example, the testing optimization system 10 analyzes the temperature values of the electronic circuit 20, or the temperature values of the MISR during the execution of the test. If the temperature values include a predetermined pattern the test configuration that causes such temperature values may be rejected (or selected, in another example).

The analysis of the parametric data may further include identifying non-switching latches based on the stimulus & measured values, (for example, stuck@ 1, stuck@0). The analysis of the parametric data may further include observing and analyzing statistics corresponding to switching activity of an individual or each predetermined latch in the electronic circuit 20 (for example, distribution, no. of switches, 0/1 string distribution, and so on). The analysis of the parametric data may further include observing latch adjacency switching (stats, as above). The analysis of the parametric data may further include analyzing individual stimulus latch switching and Individual stimulus latch adjacency switching. The analysis of the parametric data may further include analyzing parametric data of a macro latch group, which includes a set of predetermined latches from the electronic circuit 20. The analysis of the parametric data may further include analyzing simultaneous or concurrent switching statistics (0>1, 1>0), or noise statistics of the parametric data. The analysis of the parametric data may further include analyzing the statistics of the switching data represented by the parametric data using vector analysis (delta-I indication). The analysis of the parametric data may further include analyzing stumps channels switching activity statistics. The analysis of the parametric data may further include determining a correlation between observable latch(s) switching correlation (stim-observe, stim-stim, observe-observe). The analysis of the parametric data may further include statistical cone extraction analysis of the parametric data. The analysis of the parametric data may further include determining a relation between stimulus latch adjacency limitation (model analysis) and observed latch values. The analysis of the parametric data may further include analyzing input cone switching statistics (not fault sim), cone switching statistics (not fault sim), and adjacent/crossing cone (nets) switching statistics (gms for net analysis). Based on one or more analyses, the testing optimization system 10 may identify exhaustive cone stimulus vectors, same stimulus latches vectors, and same observed state vectors (no-change in observed values of latches), or a combination thereof. In addition, the testing optimization system 10 analyzes a pattern trend (such as convergent, divergent, oscillating) of the parametric data and/or latch data.

Figure 8:
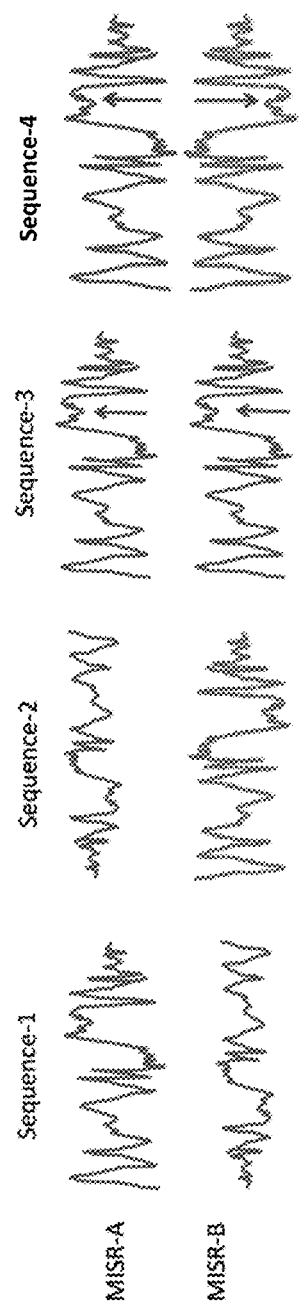
FIG. 8 illustrates an example scenario of analyzing switching activity in accordance with an embodiment.

The testing optimization system 10 compares the results of the analysis with the predetermined selection criteria, as shown at block 644. In case the selection criteria are met, the test configuration(s) are selected as part of the set of optimized test configurations. In an example, the testing optimization system 10 identifies possible fine-tuning of the execution parameters associated with the test configuration, such as the clock sequence, initial seed, as shown at block 740. For example, if the power used during execution of the test is above a prescribed maximum power of the testing system, or the testing optimization system 10, or the electronic circuit 20, the testing optimization system 10 may identify changes to the execution parameters to reduce the power used. In other words, the testing optimization system 10 identifies execution parameters, maintaining the LBIST pattern the same, to maximize switching activity while keeping power at a minimum. In an example, the testing optimization system 10 selects a testing configuration with an LBIST sequence that results in the maximum switching activity, which is determined, for example by computing a Fourier transformation (max FFT) of the parametric data, and lowest peak power. FIG. 8 illustrates an example scenario of analyzing switching activity with four parametric data sequences. In this example, parametric data from each MISR in the electronic circuit 20 represented as a waveform. For example, each sequence illustrated may be representative of electrical current values across each MISR individually during execution of the test. In another example, each sequence illustrated may be representative of temperature values across each MISR individually during execution of the test. In an example, the testing optimization system 10 sums each waveform across the MISRs until an optimized set is reached. In an example, the testing optimization system 10 analyzes the parametric data separately for electrical current values and temperature values. In another example, the testing optimization system 10 analyzes a combination of the electrical current and temperature values in the parametric data. Thus, the testing optimization system 10 optimizes the test configuration by optimizing the execution parameters of the test configuration, without changing the LBIST pattern. In another example, the testing optimization system 10 selects an optimized test configuration from a set of test configurations with corresponding results in the results database 635 based on an analysis of the corresponding execution parameters, as described herein.

In another example, the testing optimization system 10 optimizes or selects a test configuration to maximize a number of net switching during the clock sequence. In yet another example, the testing optimization system 10 optimizes or selects a test configuration to maximize a number of latches whose capture responses vary from pattern to pattern. The testing optimization system 10 ensures that the optimizations do exceed power capabilities of the automated test equipment, such as the sensors used to monitor the switching activity. Accordingly, the testing optimization system 10 facilitates to exhaustively test selected physical topologies of the electronic circuit 20, as well as stress critical timing paths by optimizing the execution parameters.

The testing optimization system 10 checks if target requirements in terms of test time/coverage are met, as shown at block 750. In case the target is met, the test configuration is added to the set of optimized test configurations, as shown at block 650. In an example, the testing optimization system may track test coverage of the test configuration by recording a signature of the switching activity of the electronic circuit 20 during the execution according to the test configuration. The signature of the switching activity may be determined by summing the waveforms of the switching activity across each MISR in the electronic circuit 20. In another example, a FFT of the switching activity waveforms may be summed. The testing optimization system may reject the test configuration in response to the signature of the switching activity of the test configuration matching a previously recorded signature for a previous test configuration. The signature of the switching activity may be determined based on the electrical current values, the temperature values, or any other parametric data recorded during execution of the test.

In an example, the testing optimization system 10 tracks the test coverage of the test configuration by recording a signature of the switching activity of the electronic circuit 20 during the execution according to the test configuration. For example, the testing optimization system 10 executes the electronic circuit 20 according to the test configuration for a predetermined number of times, and records the switching activity during each execution. The testing optimization system 20 further generates the signature of the switching activity of the test configuration based on the predetermined number of executions of the electronic circuit 20, by combining the recorded switching activity. In an example, the signature may be a logical sum, or any other technique to combine/compress multiple switching activity records. The testing optimization system 10 compares the signature of the test configuration with previously recorded signatures of previously selected test configurations. The testing optimization system 10 rejects the test configuration if the signature of the switching activity matches one or more of the previously recorded signatures of the previous test configurations. Else, the testing optimization system 10 adds the test configuration to the test configuration set 30.

In case the test configuration is rejected, the testing optimization system 10 determines modifications to the test configuration, including changes to the LBIST pattern and the execution parameters of the test configuration, to meet the selection criteria and/or the target, as shown at block 730. The modifications are fed to the test configuration generation process so that a modified test configuration is generated and evaluated by the testing optimization system 10 in a future iteration. The testing optimization system 10 identifies the modifications to the test configuration based on analyzing the LBIST pattern and the execution parameters of the test configuration in a similar manner as described regarding optimizing the execution parameters. For example, the testing optimization system 10 uses the analysis and statistics of the switching activity (that is parametric data) to optimize pattern sub-sets. For example, the testing optimization system 10 maximizes a section length and other LBIST parameters to match the switching activity pattern to the selection criteria. To this end, the testing optimization system 10 may combine variable length sections to form optimized total test sequence. In another example, the testing optimization system 10 may incorporate cone switching analysis to determine optimized pattern sections. The testing optimization system 10 may further generate optimal switching activity for burn-in stress test (50-50% state/switching) by modifying the execution parameters and the LBIST pattern of the test configuration to match a predetermined switching activity pattern that corresponds to burn-ins. A "burn-in" test may be a stress test where the electronic circuit is exposed to high amounts of heat such that parts of the electronic circuit degrade equally, such as in an oven. Further, the testing optimization system 10 may modify the test configuration to exclude the predetermined patterns such as hi delta-I patterns, and other integrated deterministic patterns for LBIST shortfalls.

The testing optimization system 10, during such modification considers sections initialization overhead vs execution time. For example, there is an overhead in setting up the tester device/testing optimization system 10 to start LBIST with a specified seed, weight value, number of clocks, and other parameters. Since, the test time includes running a large number (such as 100, 1000, 10,000 and so on) of LBIST test patterns that are generated heuristically, the test time affects the manufacturing process of the electronic circuit. The technical solutions described herein optimize test coverage and reduce the number of LBIST patterns, and thus keep the test time at a minimum, in turn speeding the manufacturing process. Thus, given a dearth of resources (space, time), the technical solutions described herein facilitate selecting an optimal set of LBIST patterns to test with and satisfy the test coverage.

The technical solutions described herein facilitate an improved test configuration generation, which is quicker and catalogs application conditions such as voltage/temperature and frequency, of which typical logic simulation techniques are unaware. The technical solutions facilitate select an optimized set of test configurations for testing an electronic circuit, such as a chip, using BIST based testing. The technical solutions monitor switching activity of a reference electronic circuit (actual hardware) during execution of a test based on one or more test configurations generated by a testing system (or any other device). Based on an analysis of parametric data of the switching activity, such as electrical current values, temperature values, voltage values, and the like, the technical solutions determine if the switching activity corresponding to the test configurations meet a selection criteria, such as predetermined patterns. The predetermined pattern, for example, may be a 'fingerprint' of a switching activity of the electronic circuit, such as a thermal fingerprint, or an electrical current fingerprint or a spatial inter-pattern analysis of latch state activity. For example, behavior of a single latch over a sequence of patterns and a relationship (Cell type, geometric location, scan chain location, and the like) to other latches or between grouping of latches or in a similar way MISRs, may be described parametrically. For example, consider that a test for a burn-in is 50% switching to avoid over stressing. To have a 50% metric implies that the amount of time spent in each of the 2 states is equal. Evaluation of such switching activity is described parametrically. The optimization goal is that the test pattern cause the electronic circuit to spend 50% of the time in one state or the other state. Using the analysis of latch states described here, the optimization is not only that each latch spends 50% time in one state or another, but also recognizing the nets and combinational logic feeding latches have 50% statistics. In such a case, the technical solutions facilitate using latch adjacency/group/geometric statistics, which provide a second optimization metric where the adjacency/group/geometric state switching over time (pattern sequences) provides confidence that associated nets are switching over time.

The fingerprint may be a region of the parametric data associated with the switching activity that uniquely identifies the switching activity. For example, a high switching activity on an MISR of a first electronic circuit and a lower switching activity on an MISR of a second electronic circuit, in response to an identical test configuration, may be indicative of a problematic electronic circuit. The difference in the two switching activities observed in this case may be above a predetermined threshold. The test configurations are either selected or rejected based on the switching activity meeting the selection criteria. The test configurations that are selected may be added to a memory on the electronic circuit for self-testing the electronic circuit. Alternatively, the test configuration may be added to a repository of optimal test configurations for the electronic circuit, the repository being accessible when testing the electronic circuit. In case the test configuration is rejected, the technical solutions further facilitate identifying modifications to the test configuration, such as the execution parameters and/or LBIST pattern of the test configuration to meet the selection criteria and/or test target such as test coverage. The test configuration generation process and analysis can be expanded to other test optimization beyond BIST based testing.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application, or technical improvement over technologies found in the marketplace, or to enable others of ordinary skill in the art to understand the embodiments disclosed herein.

What is claimed is:

1. A computer implemented method for optimizing a set of test configurations used for self-testing an electronic circuit, the method comprising:
   receiving a test configuration for testing the electronic circuit, wherein the test configuration comprises settings that initiate a set of predetermined input values for the electronic circuit and further comprises corresponding expected output values, wherein the electronic circuit comprises a set of latches;
   evaluating the test configuration for selection in the set of test configurations for self-testing the electronic circuit, the evaluation comprising:
      executing the electronic circuit according to the test configuration and recording parametric data from the electronic circuit during the execution, wherein the parametric data is representative of switching activity of the latches in the electronic circuit; and
      analyzing the parametric data to identify presence of a predetermined pattern in the switching activity; and
   adding the test configuration to the set of test configurations used for self-testing the electronic circuit in response to the predetermined pattern being absent in the switching activity.

2. The computer implemented method of claim 1, wherein the parametric data comprises electrical current used by the electronic circuit during execution according to the test configuration, and the predetermined pattern is representative of a region of low switching in the electrical current.

3. The computer implemented method of claim 1, wherein the parametric data comprises electrical current used by the electronic circuit during execution according to the test configuration, and the predetermined pattern is representative of a region of high delta in the electrical current.

4. The computer implemented method of claim 1, wherein the test configuration further comprises a set of execution parameters, the execution parameters comprising at least one of an initial seed for generating the set of predetermined input values, a clock sequence, and a set of weights for each output value.

5. The computer implemented method of claim 4 further comprising:
   setting up the electronic circuit according to the execution parameters of the test configuration; and
   monitoring the switching activity during the execution of the electronic circuit.

6. The computer implemented method of claim 1, wherein the parametric data comprises a temperature value, a current value, and a voltage value.

7. The computer implemented method of claim 1, wherein the parametric data comprises temperature values of the electronic circuit during the execution according to the test configuration, and the predetermined pattern is a predetermined thermal pattern.

8. The computer implemented method of claim 1, further comprising:
   tracking test coverage of the test configuration by recording a signature of the switching activity of the electronic circuit during the execution according to the test configuration, wherein the signature is based on a predetermined number of executions of the electronic circuit according to the test configuration; and
   rejecting the test configuration in response to the signature of the switching activity matching a previously recorded signature of a previous test configuration.

9. The computer implemented method of claim 8, wherein the signature of the switching activity is an electrical current signature based on electrical current used by a multi-input signature register of the electronic circuit during the execution.

10. The computer implemented method of claim 8, wherein the signature of the switching activity is a thermal signature based on temperature variations of a multi-input signature register of the electronic circuit during the execution.

11. The computer implemented method of claim 8, further comprising:
   in response to the test configuration being rejected:
      communicating a modification to the test configuration to change the switching activity of the electronic circuit during execution of the electronic circuit;
      receiving a modified test configuration based on the modification; and
      evaluating the modified test configuration for selection to the set of test configurations for self-testing the electronic circuit.

12. A system for optimizing a set of test configurations for self-testing an electronic circuit, the system comprising:
   a memory; and
   a processor configured to:
      receive a test configuration for testing the electronic circuit, wherein the test configuration comprises settings that initiate a set of predetermined input values for the electronic circuit and further comprises corresponding expected output values, wherein the electronic circuit comprises a set of latches;
      evaluate the test configuration for selection in the set of test configurations for self-testing the electronic circuit, the evaluation comprising:
         execution of the electronic circuit according to the test configuration and record parametric data from the electronic circuit during the execution, wherein the parametric data is representative of switching activity of the latches in the electronic circuit;
         analysis of the parametric data to identify presence of a predetermined pattern in the switching activity; and
         add the test configuration to the set of test configurations used for self-testing the electronic circuit in response to the predetermined pattern being absent in the switching activity.

13. The system of claim 12, wherein the parametric data comprises electrical current used by the electronic circuit during execution according to the test configuration, and the predetermined pattern is representative of at least one of a region of low switching in the electrical current, and a region of high delta in the electrical current.

14. The system of claim 12, wherein the parametric data comprises temperature values of the electronic circuit during the execution according to the test configuration, and the predetermined pattern is a predetermined thermal pattern.

15. The system of claim 12, wherein the processor is further configured to:
   in response to the test configuration being rejected:
      communicate a modification to the test configuration to change the switching activity of the electronic circuit during execution of the electronic circuit;
      receive a modified test configuration based on the modification; and
      evaluate the modified test configuration for selection to the set of test configurations for self-testing the electronic circuit.

16. A computer program product for optimizing a set of test configurations for self-testing an electronic circuit, the computer product comprising a non-transitory computer readable storage medium, the non-transitory computer readable storage medium comprising computer executable instructions, wherein the non-transitory computer readable storage medium comprises instructions to:
   receive a test configuration for testing the electronic circuit, wherein the test configuration comprises settings that initiate a set of predetermined input values for the electronic circuit and further comprises corresponding expected output values, wherein the electronic circuit comprises a set of latches;
   evaluate the test configuration for selection in the set of test configurations for self-testing the electronic circuit, the evaluation comprising:
      execution of the electronic circuit according to the test configuration and record parametric data from the electronic circuit during the execution, wherein the parametric data is representative of switching activity of the latches in the electronic circuit;
      analysis of the parametric data to identify presence of a predetermined pattern in the switching activity; and
      add the test configuration to the set of test configurations used for self-testing the electronic circuit in response to the predetermined pattern being absent in the switching activity.

17. The computer program product of claim 16, wherein the parametric data comprises electrical current used by the electronic circuit during execution according to the test configuration, and the predetermined pattern is representative of at least one of a region of low switching in the electrical current, and a region of high delta in the electrical current.

18. The computer program product of claim 16, wherein the parametric data comprises temperature values of the electronic circuit during the execution according to the test configuration, and the predetermined pattern is a predetermined thermal pattern.

19. The computer program product of claim 16, wherein the non-transitory computer storage medium further comprises instructions to:
   track test coverage of the test configuration by recording a signature of the switching activity of the electronic circuit during the execution according to the test configuration, wherein the signature is based on a predetermined number of executions of the electronic circuit according to the test configuration; and
   reject the test configuration in response to the signature of the switching activity matching a previously recorded signature of a previous test configuration.

20. The computer program product of claim 19, wherein the non-transitory computer storage medium further comprises instructions to:
   in response to the test configuration being rejected:
      communicate a modification to the test configuration to change the switching activity of the electronic circuit during execution of the electronic circuit;
      receive a modified test configuration based on the modification; and
   evaluate the modified test configuration for selection to the set of test configurations for self-testing the electronic circuit.

* * * * *